US007653862B2

(12) United States Patent
Hassner et al.

(10) Patent No.: US 7,653,862 B2
(45) Date of Patent: Jan. 26, 2010

(54) ERROR DETECTION AND CORRECTION FOR ENCODED DATA

(75) Inventors: Martin Hassner, Mountain View, CA (US); Rajesh Koul, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 528 days.

(21) Appl. No.: 11/154,978

(22) Filed: Jun. 15, 2005

(65) Prior Publication Data

US 2007/0011598 A1 Jan. 11, 2007

(51) Int. Cl.
*H03M 13/00* (2006.01)
*G11C 29/00* (2006.01)

(52) U.S. Cl. .................................. 714/767; 714/773
(58) Field of Classification Search ............... 714/767, 714/773
See application file for complete search history.

(56) References Cited

U.S. PATENT DOCUMENTS

| 3,568,153 | A | * | 3/1971 | Kurtz et al. ................. 714/764 |
| 3,573,728 | A | * | 4/1971 | Kolankowsky et al. ...... 714/764 |
| 3,623,155 | A | * | 11/1971 | Hsiao et al. ................ 714/785 |
| 3,634,821 | A | * | 1/1972 | Bossen et al. .............. 714/760 |
| 3,648,238 | A | * | 3/1972 | Yarrington .................. 714/762 |
| 4,077,028 | A | * | 2/1978 | Lui et al. .................... 714/777 |
| 4,117,458 | A | * | 9/1978 | Burghard et al. ............ 714/753 |
| 4,319,357 | A | * | 3/1982 | Bossen ....................... 714/753 |
| 4,354,269 | A | * | 10/1982 | Vries et al. .................. 714/793 |
| 4,564,944 | A | * | 1/1986 | Arnold et al. ............... 714/759 |
| 4,706,250 | A | * | 11/1987 | Patel .......................... 714/761 |
| 4,862,463 | A | * | 8/1989 | Chen ......................... 714/767 |
| 4,918,692 | A | * | 4/1990 | Hidaka et al. ............... 714/702 |
| 4,939,733 | A |   | 7/1990 | Furutani |
| 4,958,349 | A | * | 9/1990 | Tanner et al. ............... 714/759 |
| 5,285,454 | A |   | 2/1994 | Blaum et al. |
| 5,418,796 | A | * | 5/1995 | Price et al. .................. 714/762 |
| 5,537,429 | A | * | 7/1996 | Inoue ......................... 714/755 |
| 5,745,508 | A | * | 4/1998 | Prohofsky ................... 714/766 |
| 5,974,580 | A | * | 10/1999 | Zook et al. .................. 714/755 |
| 5,991,911 | A | * | 11/1999 | Zook ......................... 714/758 |
| 6,304,992 | B1 |   | 10/2001 | Cypher |
| 6,973,612 | B1 | * | 12/2005 | Rodi .......................... 714/766 |
| 7,171,591 | B2 | * | 1/2007 | Chen ........................... 714/52 |
| 2005/0044475 | A1 |   | 2/2005 | Yedidia et al. |

OTHER PUBLICATIONS

Soh Joo Kiat Kenneth "*Construction of Binary Linear Codes*", Undergraduate Research Opportunity Programme in Science, Department of Mathematics, National University of Singapore, 1999/2000.

Nielsen, R.R. "*List Decoding of Linear Block Codes*", Ph.D. —Thesis, Sep. 30, 2001.

* cited by examiner

*Primary Examiner*—Joseph D Torres
(74) *Attorney, Agent, or Firm*—Townsend and Townsend and Crew LLP; Patrick Duncan

(57) ABSTRACT

Embodiments of the present invention provide techniques for detecting and correcting encoded data. In one embodiment, a system for detecting and correcting errors in a plurality of data bits comprises a static memory configured to store a plurality of data bits; a systematic encoder configured to convert the plurality of data bits into a codeword; a systematic parity check encoder configured to convert the codeword into a syndrome; and a syndrome decoder configured to evaluate the syndrome based on preset criteria used to determine whether the syndrome corresponds to an uncorrectable error. A binary [16, 8, 5] code is used to encode the plurality of data bits.

6 Claims, 11 Drawing Sheets

Written Data Byte d d = [d1 d2 d3 d4 d5 d6 d7 d8]

8-Parity Check Bits, {r1,...,r8}, "+" is "modulo 2 add"

Codeword c c = [c1 c2 c3 c4 c5 c6 c7 c8 c9 c10 c11 c12 c13 c14 c15 c16]

c = [d1 d2 d3 d4 d5 d6 d7 d8 r1 r2 r3 r4 r5 r6 r7 r8]

8-Syndrome Bits, {s1,...,s8}, "+" is "modulo 2 add"

Systematic Encoder Matrix G = [I | A]

$$\begin{bmatrix} 1&0&0&0&0&0&0&0&1&1&0&0&1&1&0&1 \\ 0&1&0&0&0&0&0&0&1&1&1&0&0&0&0&1 \\ 0&0&1&0&0&0&0&0&1&0&1&1&0&1&0&0 \\ 0&0&0&1&0&0&0&0&0&1&0&0&1&1&0&1 \\ 0&0&0&0&1&0&0&0&0&1&1&1&1&0&1&1 \\ 0&0&0&0&0&1&0&0&1&0&0&1&1&0&1&0 \\ 0&0&0&0&0&0&1&0&0&0&1&0&1&0&1&1 \\ 0&0&0&0&0&0&0&1&0&1&0&1&1&1&1&0 \end{bmatrix}$$

510

Systematic Parity Check Matrix H = [A$^t$ | I]

$$\begin{bmatrix} 1&1&1&1&0&1&0&0&1&0&0&0&0&0&0&0 \\ 1&1&0&1&1&0&0&1&0&1&0&0&0&0&0&0 \\ 0&1&1&0&1&0&1&0&0&0&1&0&0&0&0&0 \\ 0&0&1&0&1&1&0&1&0&0&0&1&0&0&0&0 \\ 1&0&0&1&1&1&1&1&0&0&0&0&1&0&0&0 \\ 1&0&1&1&0&0&0&1&0&0&0&0&0&1&0&0 \\ 0&0&0&0&1&1&1&1&0&0&0&0&0&0&1&0 \\ 1&1&0&1&1&0&1&0&0&0&0&0&0&0&0&1 \end{bmatrix}$$

DECODE Single Bit Error Locations in Data Bits:
Look Up Table for 8 Syndrome Vectors for 1-Data Bit Error Locations identical to the
Corresponding Columns of $A^t$

DECODE Single Bit Error Locations in Check Bits:
Look Up Table for 8 Syndrome Vectors for 1-Check Bit Error Patterns having
Hamming Weight = 1

DECODE Single Bit Error Locations in Check Bits:
Look Up Table for 28 Syndrome Vectors for 2-Check Bit Error Patterns having Hamming Weight = 2

ERROR DETECTION AND CORRECTION FOR ENCODED DATA

CROSS-REFERENCES TO RELATED APPLICATIONS

Not Applicable

BACKGROUND OF THE INVENTION

This invention relates generally to techniques for detecting and correcting errors on storage media, and more particularly, to techniques for detecting and correcting errors in encoded data, especially data to be stored in memory such as a DRAM.

Conventional methods for DRAM protection involve the use of Hamming codes. The check bits in a Hamming code are parity bits for the data bits. Each check bit provides the parity for a unique subset of the data bits. If an error occurs (i.e., one or more bits change state), one or more syndrome bits will be asserted. Which syndrome bits are asserted may also be used to determine which data bit changes state, and enable the correction of the error.

One common use of Hamming codes is to correct single bit errors within a group of data. A single error correcting Hamming code is able to correct a single error. The error detection capability of the code may be increased by adding an additional check bit. The use of an additional check bit allows the Hamming code to detect double bit errors and correct single bit errors. The addition of a bit to increase the data detection capabilities of a Hamming code is referred to as an extended Hamming code.

The Hamming distance is the number of bits that disagree between two binary sequences of the same length. For example, if a codeword x consists of '10000' and a codeword y consists of '01100,' the Hamming distance is equal to 3. In conventional methods, in order to detect n bit errors, a coding scheme requires the use of codewords with a Hamming distance of at least n+1. In addition, a coding scheme with at least a Hamming distance of 2n+1 between the codewords is required.

The distance d of a code is defined as the minimum Hamming distance between all pairs of codewords in the code. Codes with a larger value of d have a greater error-correcting capability. Codes with parameters N and k are referred to as (N, k) codes. If the distance d is also known, then the codes are referred to as (N, k, d) codes.

BRIEF SUMMARY OF THE INVENTION

Embodiments of the present invention provide techniques for detecting and correcting encoded data. A plurality of data bits are converted to a codeword, which when data is read is converted to a syndrome. The syndrome is evaluated to determine whether it corresponds to an uncorrectable/unacceptable error. In an exemplary embodiment, a binary [16, 8, 5] code provides the ability to reliably correct 1-data bit error and detect up to 2-check bit errors in the codeword. Advantageously, the syndrome is directly mapped to acceptable syndrome sequences to quickly determine whether the syndrome is acceptable or not. The syndrome is acceptable if it corresponds to up to 1 data bit in error (which will be corrected) with no check bit error, or up to 2 check bits in error (which will be ignored) with no data bit error. The technique may be used to protect non-customer data stored in memory, such as DRAM for a hard disk drive.

In accordance with an aspect of the present invention, a system for detecting and correcting errors in a plurality of data bits comprises a static memory configured to store a plurality of data bits; a systematic encoder configured to convert the plurality of data bits into a codeword; a systematic parity check encoder configured to convert the codeword into a syndrome; and a syndrome decoder configured to evaluate the syndrome based on preset criteria used to determine whether the syndrome corresponds an uncorrectable error. A binary [16, 8, 5] code is used to encode the plurality of data bits.

In some embodiments, the memory comprises DRAM or flash memory. The systematic encoder is configured to convert 8 data bits into a 16-bit codeword. The systematic parity check encoder is configured to convert the 16-bit codeword into an 8-bit syndrome. The syndrome corresponds to no uncorrectable error if the syndrome contains at most 1 data bit in error with no check bit error, or if the syndrome contains at most 2 check bits in error with no data bit error. The syndrome decoder recognizes that no error exists and the syndrome is acceptable if the syndrome consists of all 0's. The syndrome decoder is configured to directly map the syndrome to a plurality of acceptable syndrome sequences that correspond to acceptable error patterns, a match between the syndrome and one of the acceptable syndrome sequences that correspond to acceptable error patterns indicating that the syndrome corresponds to no uncorrectable error. The plurality of acceptable syndrome sequences include a first lookup table having syndrome sequences corresponding to 1-data bit errors in the syndrome with no check bit errors. The syndrome decoder is configured to correct a 1-data bit error when the syndrome matches a syndrome sequence found in the first lookup table. The plurality of acceptable syndrome sequences include a second lookup table including syndrome sequences corresponding to 1-check bit errors in the syndrome with no data bit errors. The plurality of acceptable syndrome sequences include a third lookup table including syndrome sequences corresponding to 2-check bit errors in the syndrome with no data bit errors. The syndrome decoder is configured to flag the syndrome as corresponding to an uncorrectable error when the syndrome contains an error and there is no match between the syndrome and the acceptable syndrome sequences that correspond to acceptable error patterns.

In specific embodiments, the system is implemented in a hard disk controller. The plurality of data bits comprise non-customer data. The hard disk controller is provided in a hard disk drive. The static memory, the systematic encoder, the systematic parity check encoder, and the syndrome encoder may be provided in an integrated circuit.

In accordance with another aspect of the invention, a syndrome decoder is configured to receive a plurality of syndromes, each syndrome generated from a codeword, each codeword generated from a plurality of data bits. The syndrome decoder comprises a data bit correction module configured to detect and correct 1 data bit in error in the syndrome with no check bit error; a check bit detection module configured to detect 1 or 2 check bits in error in the syndrome with no data bit error; and a flag module configured to flag the syndrome as corresponding to an uncorrectable error if the syndrome contains an error unless either the syndrome contains 1 data bit in error with no check bit error, or the syndrome contains 1 or 2 check bits in error with no data bit error.

In some embodiments, the data bit correction module is configured to directly map the syndrome to a plurality of acceptable syndrome sequences that correspond to 1-data bit error patterns, a match between the syndrome and one of the acceptable syndrome sequences that correspond to 1-data bit error patterns indicating that the syndrome corresponds to no uncorrectable error. The check bit detection module is configured to directly map the syndrome to a plurality of acceptable syndrome sequences that correspond to 1-check bit error patterns or 2-check bit error patterns, a match between the syndrome and one of the acceptable syndrome sequences that correspond to 1-check bit error patterns or 2-check bit error patterns indicating that the syndrome corresponds to no uncorrectable error. The data bit correction module is configured to correct 1-data bit error by inverting the data bit which is in error.

In accordance with another aspect of the present invention, a method for detecting and correcting errors in a plurality of data bits comprises converting the plurality of data bits into a codeword; converting the codeword into a syndrome; and evaluating the syndrome based on preset criteria used to determine whether the syndrome corresponds to an uncorrectable error. A binary [16, 8, 5] code is used to encode the plurality of data bits.

In some embodiments, 8 data bits are converted into a 16-bit codeword, which is converted into an 8-bit syndrome. The syndrome corresponds to no uncorrectable error if it contains at most 1 data bit in error with no check bit error, or if it contains at most 2 check bits in error with no data bit error. Evaluating the syndrome comprises recognizing that no error exists and the syndrome is acceptable if the syndrome consists of all 0's. Evaluating the syndrome comprises directly mapping the syndrome to a plurality of acceptable syndrome sequences that correspond to acceptable error patterns, a match between the syndrome and one of the acceptable syndrome sequences that correspond to acceptable error patterns indicating that the syndrome corresponds to no uncorrectable error.

Another aspect of this invention is directed to a method for detecting and correcting errors in a syndrome generated from a codeword which is generated from a plurality of data bits. The method comprises detecting and correcting 1 data bit in error in the syndrome with no check bit errors; detecting 1 or 2 check bits in error in the syndrome with no data bit error; and flagging the syndrome as corresponding to an uncorrectable error if the syndrome contains an error unless either the syndrome contains 1 data bit in error with no check bit error, or the syndrome contains 1 or 2 check bits in error with no data bit error.

BRIEF DESCRIPTION OF THE DRAWINGS

FIG. 3 illustrates the composition of written data byte d, and possible parity check bit equations used to generate check bits, in accordance with an embodiment of the present invention.

FIG. 4 illustrates the composition of codeword c, and possible syndrome bit equations used to generate a syndrome, in accordance with an embodiment of the present invention.

FIG. 5 illustrates possible configurations for systematic encoder matrix G and systematic parity check matrix H in accordance with an embodiment of the present invention.

FIG. 6 illustrates an example of a lookup table used to verify 1-data bit error locations, in accordance with an embodiment of the present invention.

FIG. 7 illustrates an example of a lookup table used to verify 1-check bit error patterns in accordance with an embodiment of the present invention.

FIG. 8 illustrates an example of a lookup table used to verify 2-check bit error patterns in accordance with an embodiment of the present invention.

DETAILED DESCRIPTION OF THE INVENTION

Figure 1A:
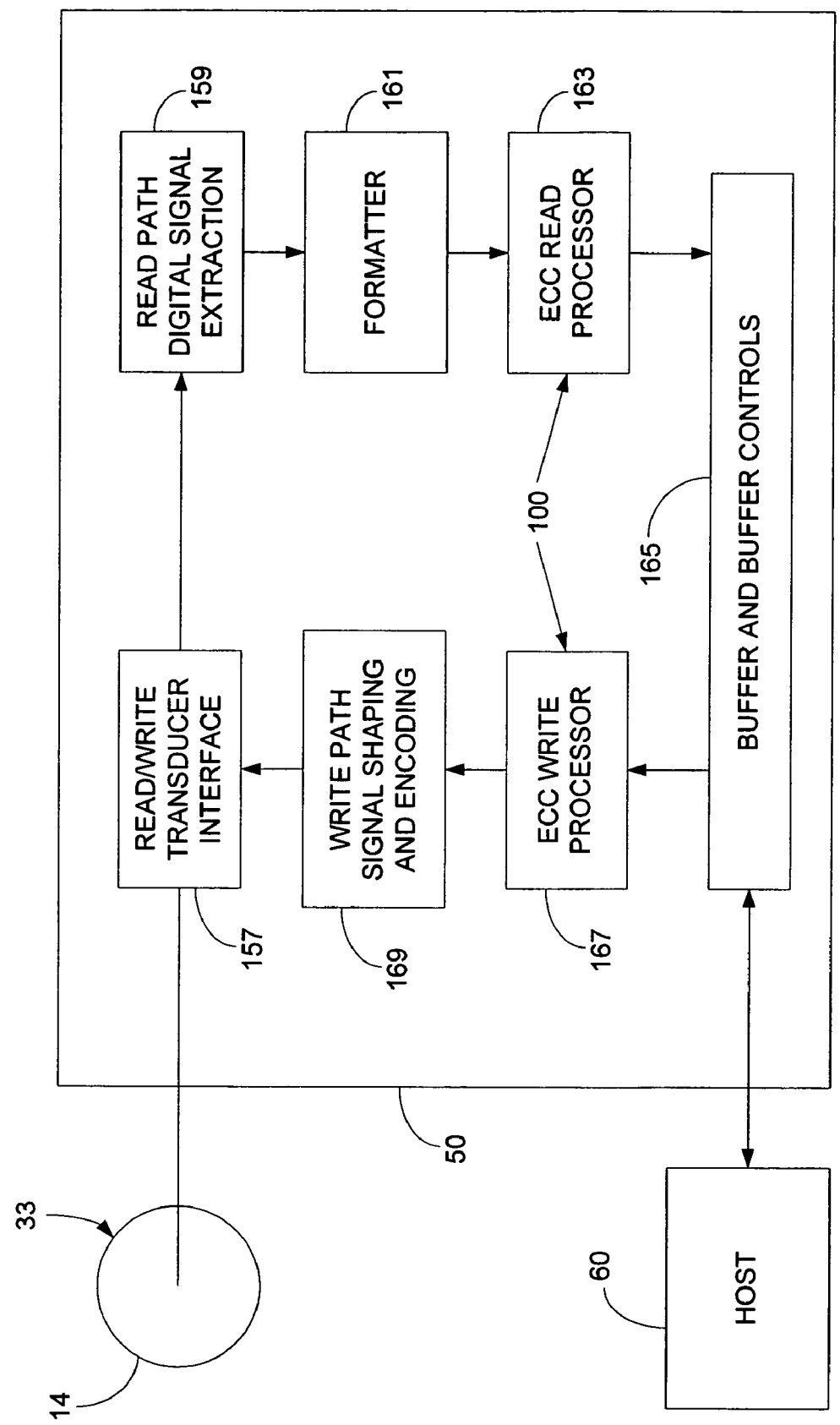
FIG. 1A is a simplified block diagram illustrating the architecture of a buffered hard disk drive controller that includes an on-the-fly error correction code (ECC) system for implementing on-the-fly error correction code.
Figure 1B:
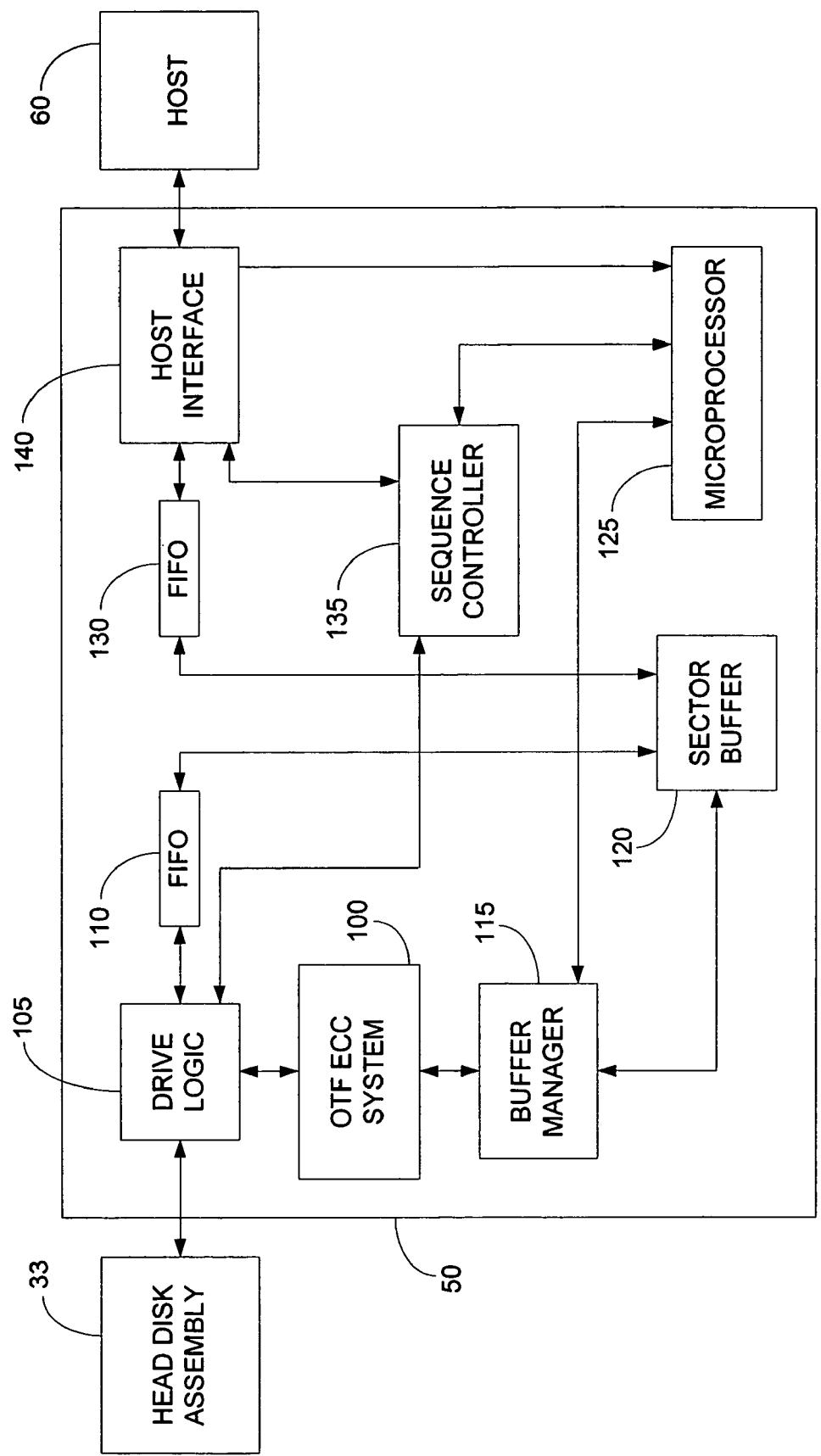
FIG. 1B is a simplified block diagram of a data storage system illustrating data flow along a read channel and a write channel of the hard disk drive controller of FIG. 1A.

FIGS. 1A and 1B illustrate an example of a hard disk drive control system for reading and writing data onto a magnetic hard disk. The hard disk drive control system of FIGS. 1A and 1B is an example of a hard disk drive system that can implement techniques that are described above. The hard disk drive system of FIGS. 1A and 1B detect and correct errors in the data read from a disk. The hard disk drive system of FIGS. 1A and 1B can be used to implement the error correction techniques of the present invention, which are discussed in further detail below.

FIG. 1A illustrates an exemplary architecture of a buffered hard disk drive controller 50. Hard disk drive controller 50 is configured to read data from and write data to a magnetic hard disk 14. Controller 50 includes an on-the-fly error correction code (ECC) system 100 for implementing an on-the-fly error correction code. On-the-fly correction code system 100 includes an ECC read processor 163 and an ECC write processor 167.

FIG. 1B is a block diagram of the hard disk drive controller 50 of FIG. 1A that includes an on-the-fly (OTF) error correction code system 100. When sequences of digital binary data are to be written on to the disk 14, they are placed temporarily in a buffer 165 shown in FIG. 1A and subsequently processed and transduced along a write path or channel (167, 169, and 157).

The hard disk drive controller 50 includes a logic drive circuit 105 shown in FIG. 1B that formats data from hard disk assembly 33, for example from 8 bits to 32 bits. A disk assembly 33 is composed of disk 14 and a head stack assembly including a spindle motor. A FIFO register 110 stores the formatted data and exchanges the same with a sector buffer 120. The ECC system 100 receives the formatted data from the drive logic circuit 105 and performs an error correction coding algorithm. ECC system 100 can also perform the techniques and processes of the present invention, which are discussed in detail below.

A buffer manager 115 controls data traffic between the ECC system 100, a sector buffer (i.e., random access memory) 120, and a microprocessor 125. Another FIFO register 130 stores data and exchanges the same with the sector buffer 120. A sequence controller 135 is connected between the drive logic circuit 105, the microprocessor 125, and a host interface 140, to control the sequence operation of the data traffic and various commands across the hard drive controller 50. The host interface 140 provides an interface between the hard drive controller 50 and a host 60.

First, a predetermined number of binary data elements (also termed bytes) in a data string are moved from the buffer 165 and streamed through an ECC write processor 167. In the ECC write processor 167, the data bytes are mapped into codewords drawn from a suitable linear block or cycle code such as a Reed-Solomon code. Next, each codeword is mapped in a write path signal-shaping unit 169 into a run length limited or other bandpass or spectral-shaping code and changed into a time-varying signal. The time-varying signal is applied through an interface read/write transducer interface 157 and then to the write element in a magneto resistive (or other suitable transducer head) for conversion into magnetic flux patterns.

All of the measures starting from the movement of the binary data elements from buffer 165 until the magnetic flux patterns are written on a selected disk track as the rotating disk 14 passes under the read/write head are synchronous and streamed. For purposes of efficient data transfer, the data is de-staged (written-out) or staged (read) one codeword at a time.

Thus, both the mapping of binary data into Reed-Solomon codewords and the conversion to flux producing time-varying signals must be done well within the time interval defining a unit of recording track length moving under the transducer. Typical units of recording track length are equal fixed-length byte codewords of 512 bytes.

When sequences of magnetic flux patterns are to be read from the disk 14, they are processed in a read path or channel (157, 159, 161, and 163) and written into the buffer 165. The time-varying signals sensed by a transducer are passed through the read/write transducer interface 157 to a digital signal extraction unit 159. Here, the signal is detected and a decision is made as to whether it should be resolved as a binary 1 or 0. As these 1's and 0's stream out of the signal extraction unit 159, they are arranged into codewords in the formatting unit 161.

Because the read path is evaluating sequences of Reed-Solomon codewords previously recorded on the disk 14, absent error or erasure, the codewords should be the same. In order to test whether that is the case, each codeword is applied to an ECC read processor 163 over a path from a formatter 161.

Also, the output from the ECC processor 163 is written into buffer 165. The read path also operates in a synchronous data-streaming manner such that any detected errors must be located and corrected within the codeword well in time for the ECC read processor 163 to receive the next codeword read from the disk track. The buffer 165 and the read and write channels may be monitored and controlled by the microprocessor 125 to ensure efficiency where patterns of referencing may dictate that a path not be taken down, such as sequential read referencing.

Data bytes are typically stored in a data storage disk in codewords. Subsets of the codewords are grouped into long blocks. Each codeword contains first level CRC/ECC bytes, and each block includes second level ECC bytes.

A data storage system uses the first level CRC and ECC bytes to locate and to correct errors in data bytes within a codeword. When there are too many errors in the data bytes to be corrected by the first level ECC bytes, the data storage system uses the second level $ECC_B$ bytes to correct the errors as described in detail above. $ECC_B$ bytes are used for correcting data bytes in any of the codewords in a block. Miscorrection of an error can happen when both of the first level and the second level CRC and ECC bytes are in error.

Non-customer data that is stored in DRAM contains fixed instructions which pertain to hard disk drive instructions. This data is particularly sensitive; therefore, it is important to protect this non-customer data from DRAM failure. Typical non-customer data comprises a size of 10-20 kilobytes (kB), although it should be appreciated that this size may vary. In an exemplary embodiment of the present invention, a binary [16, 8, 5] code, with a Hamming distance of 5, can be used to protect non-customer data of DRAM.

Figure 2:
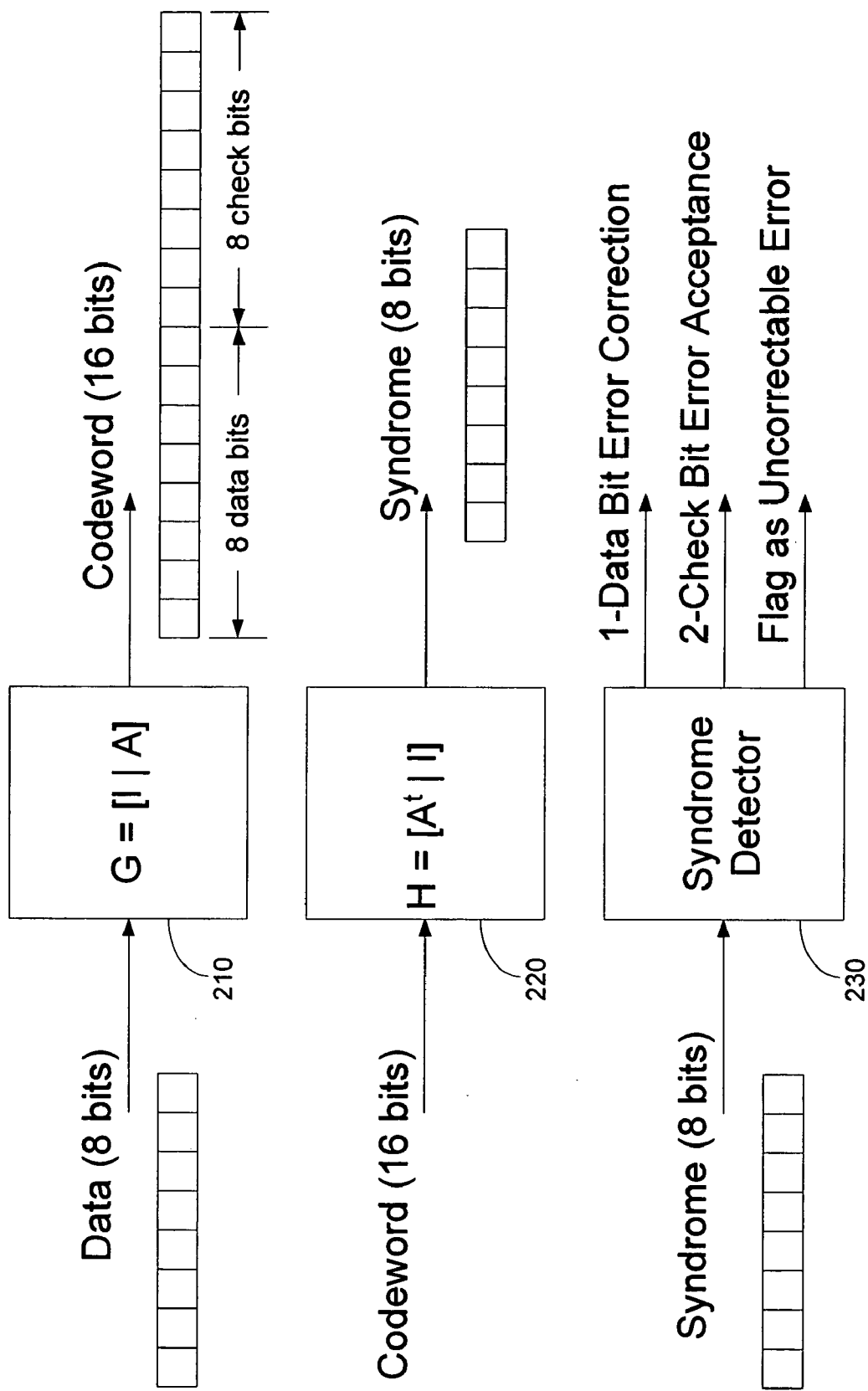
FIG. 2 illustrates a simplified block diagram of a detection and correction system for encoded data in accordance with an embodiment of the present invention.

FIG. 2 illustrates a simplified block diagram of a detection and correction system for encoded data in accordance with an embodiment of the present invention. Systematic encoder 210 is configured to take in data bits (e.g., non-customer data bits) and produce codewords. For example, 8 data bits may be input to systematic encoder 210 to produce a codeword of 16 bits, where such a codeword consists of 8 data bits and 8 check bits. In one embodiment of the present invention, systematic encoder 210 can be represented in the matrix form G=[I|A]. Systematic parity check encoder 220 is configured to take in a codeword and produce a syndrome. For example, a codeword of 16 bits may be input to systematic parity check encoder 220 to produce a syndrome of 8 bits. In one embodiment of the present invention, systematic parity check encoder 220 can be represented in the matrix form H=[A$^t$|I], where A$^t$ is the transpose of A. Syndrome decoder 230 is configured to take in syndromes and compare each syndrome to syndrome sequences found in lookup tables to determine the following outcomes: no error exists, a 1-data bit error needs to be corrected, up to 2-check bit errors are to be accepted, or an uncorrectable error (i.e., more than 1-data bit error or more than 2-check bit errors) in the syndrome needs to be flagged. For example, a syndrome of 8 bits is compared to various syndrome sequences located in a plurality of lookup tables to verify if the syndrome matches with a particular syndrome sequence found in each lookup table (i.e., whether the syndrome contains a 1-data bit error, or 1 or 2-check bit errors). It can be appreciated that systematic encoder 210, systematic parity check encoder 220, and syndrome decoder 230 can be implemented with hardware circuitry and/or software.

FIG. 3 illustrates the composition of written data byte d, and possible parity check bit equations used to generate check bits, in accordance with an embodiment of the present invention. Written data byte d may consist of 8 bits of data (i.e., d1 to d8). The data bits are converted into a codeword. The codeword may comprise 16 bits in total, where 8 bits of the codeword consist of the original 8 data bits and the other 8 bits of the codeword consist of 8 check bits (i.e., codeword c=[d1 d2 d3 d4 d5 d6 d7 d8 r1 r2 r3 r4 r5 r6 r7 r8]). The check bits (i.e., r1 to r8) may be generated by a series of parity check bit equations. For example, the check bits are generated as "r=d*G", where "d=[d1 d2 d3 d4 d5 d6 d7 d8]" and G is a mathematical representation of systematic encoder 210. As shown in FIG. 3, first check bit r1 is generated by the equation "r1=d6+d5+d4+d3+d2+d1", where '+' represents modulo 2 addition. When using modulo 2 addition, '1+1=0' and '0+1=1'. Thus, in determining the value for r1, data bits d7 and d8 are ignored. Likewise, for each parity check bit equation, only a portion of written data byte d is needed to produce each check bit.

To better illustrate data bit to codeword conversion, a specific example will be described. Allow written data byte d to equal [0 1 0 1 0 1 0 1]. Therefore, d1=0, d2=1, etc. 8 check bits are generated based on "r=d*G", where G may be represented by systematic encoder matrix 510 as shown in FIG. 5. Matrix 510 consists of the identity matrix and matrix A (i.e., G=[I|A]). Because 8 data bits are used as input, matrix A has a size of 8×8. It should be appreciated that matrix A as shown in FIG. 5 is merely an example, and matrix A could be represented by other sizes and binary sequences. By taking d and multiplying this data byte by G, one can see that the 1s in matrix A correspond to the data bits required to generate check bits r1 to r8. Thus, in using the current example:

$$r1=1+0+1+0+1+0=1$$

$$r2=1+1+0+1+0=1$$

$$r3=0+0+0+1=1$$

$$r4=1+1+0+1+0=1$$

$$r5=1+0+1+0=0$$

$$r6=1+0+0+0=1$$

$$r7=1+0+1+0=0$$

$$r8=0+0+1+1+0=0$$

Thus, $r=[1\ 1\ 1\ 1\ 0\ 1\ 0\ 0]$, where $r=[r1\ r2\ r3\ r4\ r5\ r6\ r7\ r8]$. The codeword produced by the systematic encoder matrix can be represented by $c=[0\ 1\ 0\ 1\ 0\ 1\ 0\ 1\ 1\ 1\ 1\ 1\ 0\ 1\ 0\ 0]$, where c is the codeword.

FIG. 4 illustrates the composition of codeword c, and possible syndrome bit equations used to generate a syndrome, in accordance with an embodiment of the present invention. Codeword c may consist of 16 bits (i.e., c1 to c16). The codeword bits are converted to a syndrome. The syndrome may comprise 8 bits. The syndrome bits may be generated by a series of syndrome bit equations. For example, the syndrome bits are generated as "s=c*H", where "c=[c1 c2 c3 c4 c5 c6 c7 c8 c9 c10 c11 c12 c13 c14 c15 c16]" and H is a matrix representation of systematic parity check encoder 220. As shown in FIG. 4, first syndrome bit s1 is generated by the equation "s1=c9+c6+c5+c4+c3+c2+c1", where '+' represents modulo 2 addition. Thus, in determining the value for s1, codeword bits c7, c8, and c10 through c16 are ignored. Likewise, for each syndrome bit equation (i.e., s1 to s8), only a portion of codeword c is needed to produce each syndrome bit.

To better illustrate codeword to syndrome conversion, a specific example will be described. Codeword c is set to equal $[0\ 1\ 0\ 1\ 0\ 1\ 0\ 1\ 1\ 1\ 1\ 1\ 0\ 1\ 0\ 0]$, the same codeword used in the example above. Therefore, c1=0, c2=1, etc. Eight syndrome bits are generated based on "s=c*H", where H may be represented by systematic parity check matrix 520 as shown in FIG. 5. Matrix 520 consists of the A matrix transposed (i.e., $A^t$) and the identity matrix (i.e., $H=[A^t|I]$). Because 8 syndrome bits are to be outputted, matrix $A^t$ has a size of 8×8. It should be appreciated that matrix $A^t$ as shown in FIG. 5 is merely an example, and matrix $A^t$ could be represented by other sizes and binary sequences. By taking c and multiplying this codeword by H, one can see that the 1s in matrix H correspond to the codeword bits required to generate syndrome bits s1 to s8. Thus, in using the current example:

$$s1=1+1+0+1+0+1+0=0$$

$$s2=1+1+0+1+1+0=0$$

$$s3=0+0+0+1+1=0$$

$$s4=1+1+0+1+0+1=0$$

$$s5=1+0+1+0+0=0$$

$$s6=1+0+0+1+0=0$$

$$s7=1+0+1+0+0=0$$

$$s8=0+0+1+1+0+0=0$$

Thus, $s=[0\ 0\ 0\ 0\ 0\ 0\ 0\ 0]$, where $s=[s1\ s2\ s3\ s4\ s5\ s6\ s7\ s8]$. It should be noted that in the above example, no errors have occurred; therefore syndrome s consists of all 0's. However, when encoding data, errors may occur within the data. When errors do occur in the data, such as a codeword containing check bits inaccurately corresponding to the original data bits, the syndrome sequence would consist of various permutations of 1's and 0's.

FIG. 6 illustrates an example of a lookup table used to verify 1-data bit error locations, in accordance with an embodiment of the present invention. It should be appreciated that lookup table 610 is merely an example, and could be represented by other sizes and sequences. In the example shown, 8 syndrome sequences are located in lookup table 610 which represent possible 1-data bit error locations of the data. For example, the first sequence [1 1 0 0 1 1 0 1] corresponds to a 1-data bit error in the d1 location of data byte d. The subsequent sequences in lookup table 610 correspond to a 1-data bit error in the d2 through d8 location of data byte d, respectively. After determining the location of the 1-data bit error, the syndrome bit in error may be corrected by inverting the bit identified to be erroneous. In the present embodiment, after it is determined than an error exists in the data bits, if syndrome s is compared to the syndrome sequences of lookup table 610 and no match occurs, more than 1-data bit error exist (i.e., 2 or more data bit errors exist). When 2 or more data bit errors do exist, the system flags the syndrome s as an uncorrectable error. The use of the binary [16, 8, 5] code allows the reliable correction of a 1-data bit error. Even though it can detect 2 or more data bit errors, the system flags such errors as uncorrectable errors to avoid possible miscorrection.

FIG. 7 illustrates an example of a lookup table used to verify 1-check bit error patterns in accordance with an embodiment of the present invention. Each sequence has a Hamming weight of 1 (i.e., only one bit is in error in each sequence). It should be appreciated that lookup table 710 is merely an example, and could be represented by other sizes and sequences. In the present embodiment, 8 syndrome sequences are located in lookup table 710 which represent possible 1-check bit error patterns of the check byte (i.e., r1 to r8). For example, the first sequence [1 0 0 0 0 0 0 0] corresponds to a check bit error in the r1 location of check byte r. The subsequent sequences in lookup table 710 correspond to check bit errors in the r2 through r8 location of check byte r, respectively. In the present embodiment, if syndrome s matches with a sequence located in lookup table 710, it can be assumed that 2 or more check bit errors do not exist, since a match with 1-check bit error has been verified.

Figure 8:
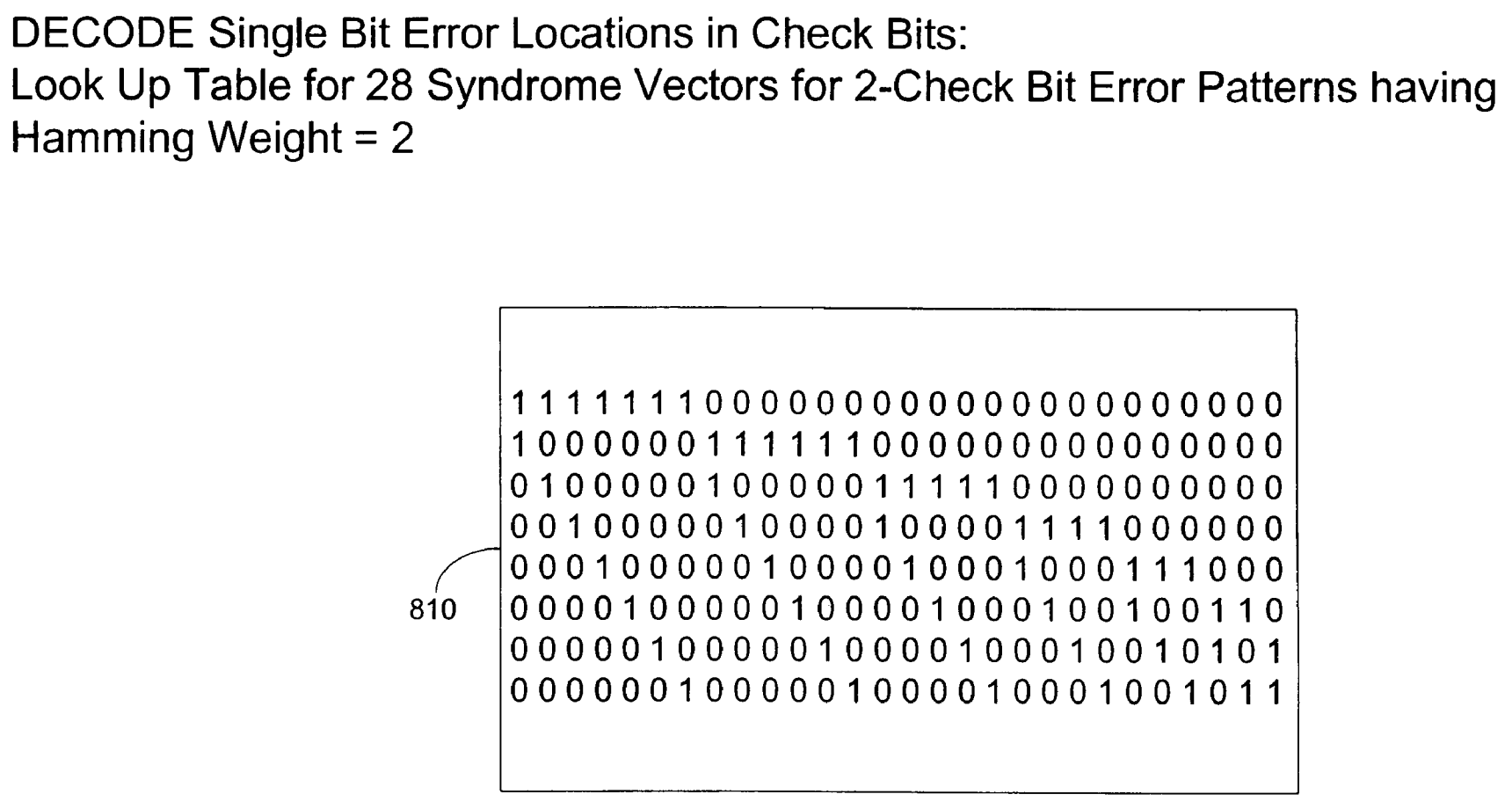

FIG. 8 illustrates an example of a lookup table used to verify 2-check bit error patterns in accordance with an embodiment of the present invention. The lookup table 810 contains 28 syndrome vectors for 2-check bit error patterns. Each sequence has a Hamming weight of 2. It should be appreciated that lookup table 810 is merely an example, and could be represented by other sizes and sequences. The syndrome sequences in lookup table 810 correspond to possible permutations of 2-check bit errors in the r1 through r8 locations of check byte r. In the present embodiment, if syndrome s matches with a sequence located in lookup table 810, it can be assumed that more than 2-check bit errors do not exist, since a match with a 2-check bit error has been verified.

Figure 9:
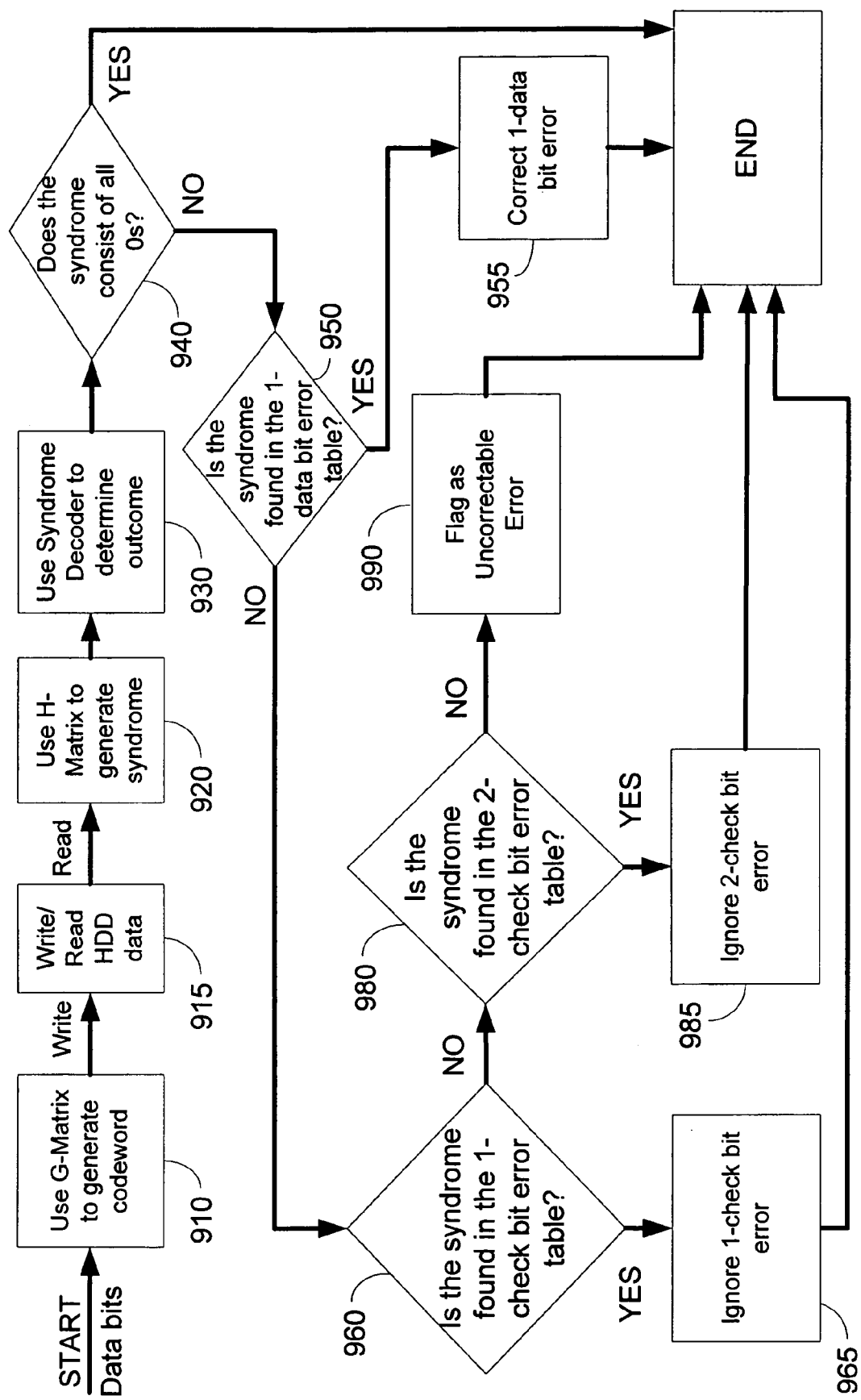
FIG. 9 illustrates a flowchart for detecting and correcting errors in encoded data in accordance with an embodiment of the present invention.

FIG. 9 illustrates a flowchart for detecting and correcting errors in encoded data in accordance with an embodiment of the present invention. The methodology is based on the criterion that the encoded data is acceptable if and only if:
 (1) there is no data bit error and no check bit error (all 0's in syndrome); or (2) there is 1 data bit error (which will be corrected) and no check bit error (a match with one of the syndrome sequences in table 610 of FIG. 6); or (3) there is no data bit error and either 1 or 2 check bit errors (a match with one of the syndrome sequences in either table 710 of FIG. 7 or table 810 of FIG. 8).

Therefore, the data is considered uncorrectable or unacceptable if:

(1) there are 2 or more data bit errors; or (2) there are 3 or more check bit errors; or (3) there is 1 data bit error and 1 or more check bit errors.

In step 910, data bits (e.g., non-customer data bits) are input to a G-Matrix to generate a codeword. The G-Matrix may be represented by systematic encoder matrix 510 and implemented in hardware and/or software form as represented in block 210 (see FIG. 2). For example, 8 data bits are input to matrix 510 to produce a codeword comprising 16 bits, where the codeword consists of 8 data bits and 8 check bits. It can be appreciated that any number of data bits may be input to the G-matrix to produce a codeword, where the codeword comprises a number of bits larger than the number of input data bits. After data is written to an HDD (step 915) and read from the HDD, the codeword is input to an H-Matrix to generate a syndrome in step 920. The H-Matrix may be represented by systematic parity check matrix 520 and implemented in hardware and/or software form as represented in block 220 (see FIG. 2). For example, a codeword comprising 16 bits is converted to a syndrome comprising 8 bits. In step 930, the syndrome is sent to syndrome decoder 230 (see FIG. 2) to determine the appropriate outcome that should be taken (i.e., identify that no error exists, correct 1-data bit error, accept up to 2-check bit errors, flag syndrome as an uncorrectable error). Syndrome decoder 230 will recognize that no error exists if the syndrome consists of all 0's. For acceptable errors, syndrome decoder 230 includes lookup table 610 (to determine whether a 1-data bit error exists), lookup table 710 (to determine whether a 1-check bit error exists), and lookup table 810 (to determine whether a 2-check bit error exists). In step 940, syndrome decoder 230 verifies whether the syndrome consists of all 0s. When the syndrome consists of all 0's, syndrome decoder 230 recognizes that there is no error, and syndrome decoder may then evaluate a subsequent syndrome generated by systematic parity check matrix 520 (block 220). Thus, a syndrome contains errors only when the syndrome has nonzero entities.

Next, in step 950, if the syndrome contains nonzero entities, the syndrome is compared to the 1-data bit error lookup table 610, to verify whether a 1-data bit error has occurred within the data byte portion of the codeword. If the syndrome matches with any sequence found in lookup table 610, syndrome decoder 230 recognizes that only 1 data bit is in error, and syndrome decoder 230 is configured to correct the 1-data bit error (step 955). This ends the data detection and correction process. If the syndrome is not found in lookup table 610, it may be assumed that either more than 1-data bit error exists or there are 1 or more check bit errors.

In step 960, the syndrome is compared to 1-check bit lookup table 710 to verify whether a 1-check bit error has occurred within the check byte portion of the codeword. Thus, if the syndrome is found to match any sequence found in lookup table 710, syndrome decoder 230 recognizes that 1-check bit error has occurred, and syndrome decoder 230 accepts (ignores) such an error, as shown in step 965. If the syndrome is not found in lookup table 710, the syndrome is compared to 2-check bit error lookup table 810 to verify whether a 2-check bit error has occurred within the check byte portion of the codeword (step 980). If such a match occurs, the system recognizes that a 2-check bit error has occurred, and this error is accepted (ignored), as shown in step 985. It is noted that because the three lookup tables used in steps 950, 960, and 980 are exclusive, the sequence of these steps may be altered.

It should be appreciated that the syndrome decoder of the present embodiment can ignore or accept up to 2-check bit errors without flagging an error within the syndrome. Thus, the syndrome decoder of the present embodiment is configured to correct 1-data bit error with no check bit error, and accept up to 2-check bit errors with no data bit error. Any other sequences are flagged as uncorrectable errors. For example, if the syndrome that contains an error does not match any of the syndrome sequences in 1-data bit error lookup table 610, 1-check bit error lookup table 710, or 2-check bit error lookup table 810, an uncorrectable error flag is implemented as shown in step 990. In the present embodiment, the lookup tables are exclusive (i.e., if the syndrome matches an entry in one table for errors, if cannot also match an entry in another table for errors). With this implementation, there is no logical confusion as to what error has occurred. It should be appreciated that the syndrome decoder of the present embodiment is configured to evaluate a plurality of syndromes.

The use of binary [16, 8, 5] code according to the exemplary embodiment described above reduces the likelihood of false error detection within data to be stored (e.g., non-customer data stored in a DRAM). The use of binary [16, 8, 5] code maintains the low complexity of a simple Hamming code implementation, where the encoder/decoder of the present embodiment is as simple to implement as a Hamming code encoder/decoder. In addition, the use of binary [16, 8, 5] code can reliably correct 1-data bit errors as fast as a simple Hamming code. The use of the Hamming distance of 5 in the binary [16, 8, 5] code is important because it allows the system to reliably correct 1-data bit error and detect and accept up to 2-check bit errors.

Figure 10:
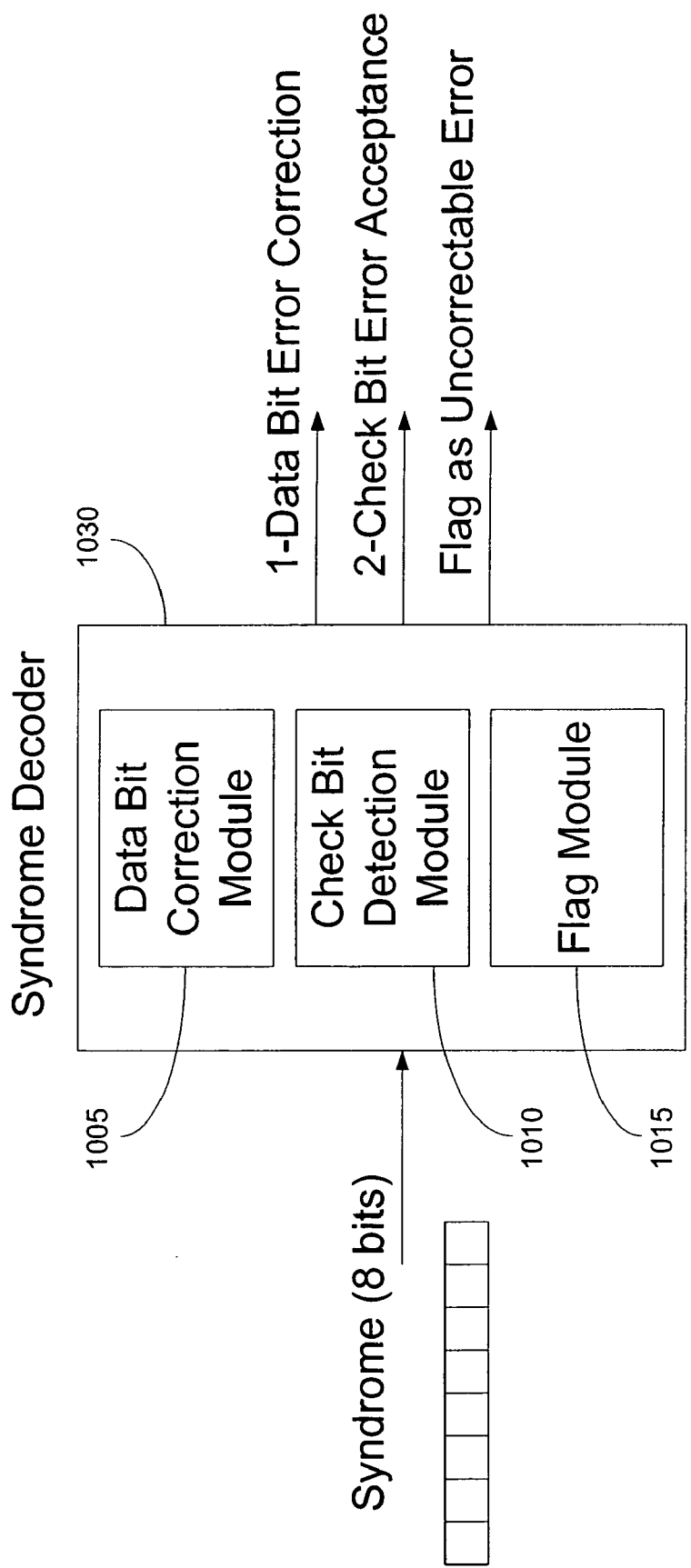
FIG. 10 illustrates a simplified block diagram of the syndrome decoder in accordance with an embodiment of the present invention.

FIG. 10 illustrates a simplified block diagram of the syndrome decoder in accordance with an embodiment of the present invention. To verify acceptable errors, syndrome decoder 1030 includes modules configured to take in syndromes and compare each syndrome to syndrome sequences found in lookup tables to determine the following outcomes: a 1-data bit error needs to be corrected with no check bit error, up to 2-check bit errors are to be accepted with no data bit error, or an uncorrectable error (i.e., more than 1-data bit error or more than 2-check bit errors or both data bit error and check bit error exist) in the syndrome needs to be flagged. In data bit correction module 1005, a syndrome that contains errors is compared to various syndrome sequences to determine whether the syndrome corresponds to a 1-data bit error with no check bit error, preferably using lookup table 610 of FIG. 6. The syndrome is compared to various syndrome sequences located in check bit detection module 1010 to determine whether the syndrome corresponds to a 1-check bit error or 2-check bit error with no data bit error, preferably using lookup table 710 of FIG. 7 and lookup table 810 of FIG. 8. Flag module 1015 is configured to flag the syndrome as corresponding to an uncorrectable error if the syndrome does not correspond to or match any plurality of syndrome sequences found in any of the lookup tables. It can be appreciated that syndrome decoder 1030 can be implemented with hardware circuitry and/or software.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A system for detecting and correcting errors in a plurality of data bits, the system comprising:
    a memory configured to store a plurality of data bits;
    a systematic encoder configured to convert the plurality of data bits stored in memory into a codeword;
    a systematic parity check encoder configured to convert the codeword received from the systematic encoder into a syndrome; and
    a syndrome decoder configured to evaluate the syndrome by directly mapping the syndrome to a plurality of acceptable syndrome sequences from a plurality of look up tables, wherein the plurality of lookup tables correspond to acceptable error patterns used to determine whether the syndrome corresponds to an uncorrectable error and include a first lookup table, a second lookup table, and a third lookup table,
    wherein a binary [16, 8, 5] code is used to encode the plurality of data bits;
    wherein the systematic encoder is configured to convert 8 data bits into a 16-bit codeword; and
    wherein evaluation of the syndrome by the syndrome decoder includes the steps:
        a) determine there are no errors if the syndrome consists of all zeros;
        b) determine that a 1-data bit error exists if the syndrome is found in the first look up table stored in memory;
        c) determine that a 1-check bit error exists if the syndrome is found in the second lookup table stored in memory;
        d) determine that a 2 check bit error exists if the syndrome is found in the third lookup table stored in memory; and
        e) determine that syndrome corresponds to an uncorrectable error if the syndrome is not in any of the plurality of lookup tables.

2. The system of claim 1 wherein the memory comprises DRAM or flash memory.

3. A hard disk controller comprising the system of claim 1.

4. The hard disk controller of claim 3 wherein the plurality of data bits comprise non-customer data.

5. A hard disk drive comprising the hard disk controller of claim 3.

6. The system of claim 1 wherein the memory, the systematic encoder, the systematic parity check encoder, and the syndrome encoder are provided in an integrated circuit.

* * * * *